(12) United States Patent
Cordes et al.

(10) Patent No.: US 7,029,830 B2
(45) Date of Patent: Apr. 18, 2006

(54) PRECISION AND APERTURES FOR LITHOGRAPHIC SYSTEMS

(75) Inventors: Steven Alan Cordes, Yorktown Heights, NY (US); Michael James Cordes, Newburgh, NY (US); James Louis Speidell, Poughquag, NY (US); Scott Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 09/940,415

(22) Filed: Aug. 28, 2001

(65) Prior Publication Data

US 2003/0049569 A1 Mar. 13, 2003

(51) Int. Cl.
*G02F 7/00* (2006.01)

(52) U.S. Cl. .............................. 430/321; 216/2; 216/24

(58) Field of Classification Search ................ 430/321, 430/5; 216/2, 24
See application file for complete search history.

(56) References Cited

U.S. PATENT DOCUMENTS 5,972,794 A * 10/1999 Katakura ..................... 438/383
2001/0016294 A1 * 8/2001 Yahiro .......................... 430/30

FOREIGN PATENT DOCUMENTS

JP          11-168049 A * 6/1999

OTHER PUBLICATIONS

Computer-generated translation of JP 11-168049 with abstract, Norihiro, Jun. 1999.*

* cited by examiner

*Primary Examiner*—John A. McPherson
(74) *Attorney, Agent, or Firm*—Thomas A. Beck; Daniel P. Morris

(57) ABSTRACT

Aperture members are provided wherein there is thin 1–10 micrometer thick crystaline membrane that is surrounded by a frame of a bulk type crystalline material. The aperture being an opening through the membrane in a typical shape useful for device fabrication, such as a circle or pattern. The aperture member of the invention can be fabricated out of a typical silicon crystalline wafer in a process where doping in a region serves as an etch stop.

1 Claim, 2 Drawing Sheets

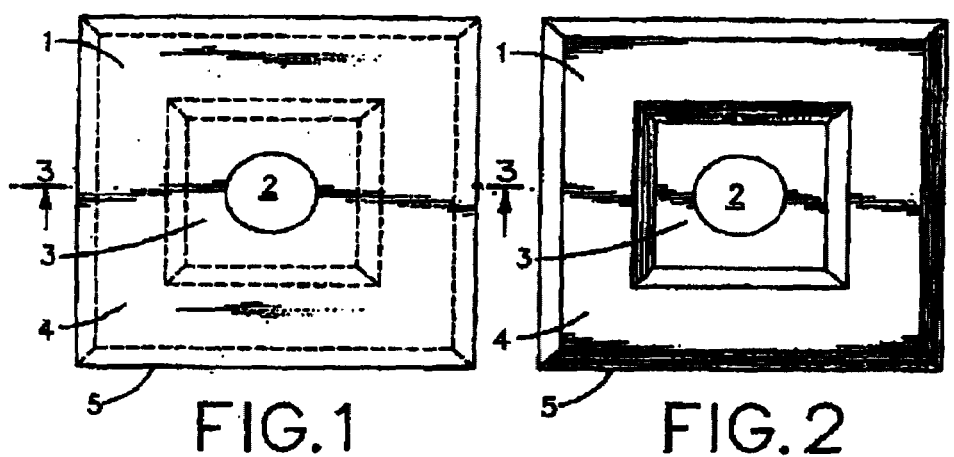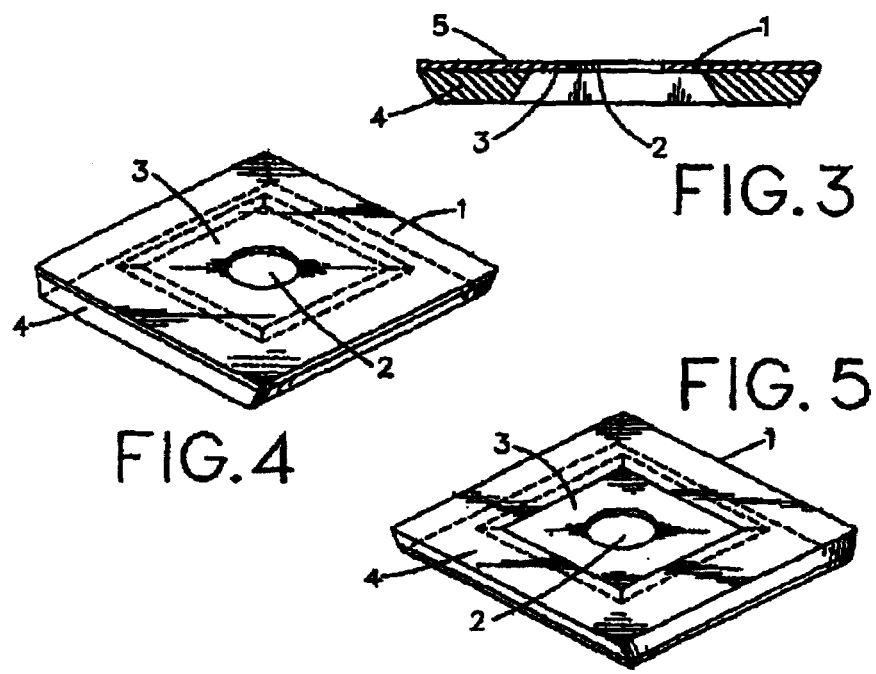

PRECISION AND APERTURES FOR LITHOGRAPHIC SYSTEMS

FIELD OF THE INVENTION

The invention is in the field of apertures for lithography used in the fabrication of micrometer size devices and in particular to the providing of high precision apertures that emulate optical components in lithography.

BACKGROUND OF THE INVENTION

In lithography, the progressive downsizing of device dimensions, the apertures used in the systems, reach a situation where there are precise, area and location energy passing openings, in a member, that is relatively opaque to the energy and that member is so thin that avoiding damage to the member in fabrication, while providing support both in fabrication and in use, becomes difficult to achieve. The difficulty becomes increasingly acute where the aperture becomes a component in a simulation tool used in selecting the equipment that makes up the lithography system.

Lithography tools involving such systems have come to be known in the art as Aerial Image Measurement Systems (AIMS). Such tools allow the user to simulate a wide variety of processes by providing the ability to vary such unique parameters as wavelength and system optical properties such as numerical aperture. A critical component of any lithography system is in aperture which emulates the optical components in the system. Such an aperture would be ideally infinitely thin, perfectly smooth, exactly normal to the optical path, perfectly flat, and exactly shaped (a perfect circle for instance). A variety of aperture image shape openings such as the circle, and such patterns as double adjacent "D" openings, dual positioned circle openings and quad positioned opening patterns, are currently receiving attention in the art. Of the techniques for making the apertures at the present state of the art not all the patterns can be fabricated equally well.

At the present state of the art the apertures for these tools have traditionally been made by forming openings through metal foil that is typically 10 to 50 micrometers thick by such fabrication operations as mechanically punching and drilling. In general mechanical techniques involving punching, drilling and milling involve deformation and smearing of the thin member material resulting in image fidelity deterioration or damaging flatness so that use is mostly at dimensions of 100 micrometers or more. There are also wet etch techniques being investigated in the art but these techniques encounter difficulty resulting from the need for thinness so that minimum feature size and image resolution becomes approximately the thickness at the aperture. Investigations are taking place using photomasking technology for images in chromium on quartz. Such a technique introduces quartz as an additional optical component and would be expected to introduce an uncontrollable variable in short wavelength applications.

SUMMARY OF THE INVENTION

Aperture members are provided wherein there is a thin member containing the opening in an area of crystalline material that is surrounded by and is epitaxial with a frame of a bulk type of the same material. The high precision apertures of the invention permit fabrication with higher quality and higher contrast than available heretofore in the art. With the invention, aperture members are achieved in which a membrane crystalline member about 1 to 5 micrometers thick is supported around the periphery by an essentially epitaxial frame of the crystalline member material. In the free standing or unsupported portion of the membrane, the aperture is located, the aperture being an opening through the membrane in a typical shape useful for device fabrication, such as a circle or pattern. The aperture member of the invention can be fabricated out of a typical semiconductor crystalline wafer.

BRIEF DESCRIPTION OF THE DRAWINGS

FIGS. 1–5 are views of a depiction of the aperture member of the invention in which:

FIG. 1 is a view from above the aperture member,

FIG. 2 is a view from below the aperture member,

FIG. 3 is a cross section view, along the lines 3—3 of FIG. 2, of the aperture member, FIG. 4 is a perspective view of the aperture member from above, and, FIG. 5 is a perspective view of the aperture member from below.

DESCRIPTION OF THE INVENTION

Figure 6:
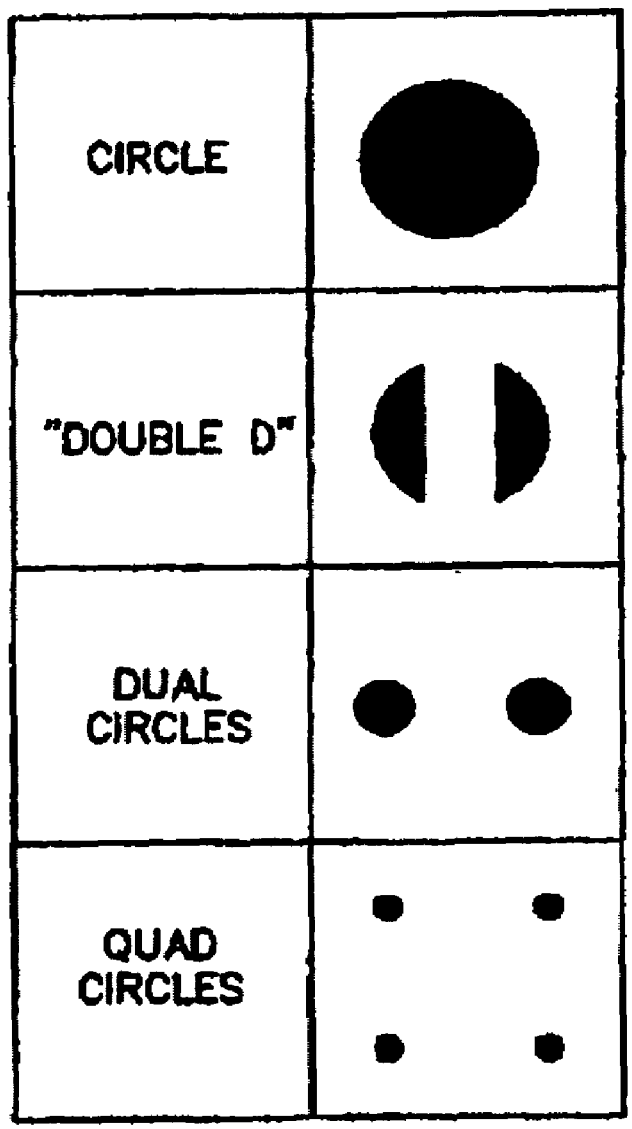
FIG. 6 is a table of typical aperture opening shapes and patterns used to fabricate devices in the art.

In the invention, high precision aperture members are provided, having a selected shape opening through an area of a very thin membrane member that is epitaxially contiguous with a frame member of the same material surrounding the area. The aperture member of the invention may be at least a portion of an essentially monocrystalline material semiconductor wafer. The invention is illustrated in connection with FIGS. 1–5.

Referring to FIGS. 1–3, wherein FIG. 1 is a view from above, FIG. 2 is a view from below and FIG. 3 is a cross sectional view along the line 3—3 of FIG. 2 and the energy source is normal to the plane of FIGS. 1 and 2.

In FIG. 1, the view from above, in a continuous surface 1, there is a precisely located aperture 2 positioned in an unsupported portion 3 of a membrane layer 5 of crystalline material that is surrounded by and epitaxially joined to a frame member 4, shown dotted, of the same crystalline material. In FIG. 2, the view from below, the frame member 4 surrounds the unsupported portion 3 of the membrane layer 5 that in turn surrounds the aperture 2. In FIG. 3 the membrane layer 5 is of crystalline material that has imparted to it an etch responsiveness difference as compared to a bulk etch responsiveness of the epitaxially joined frame 4, as would occur where the layer 5 were to be heavily doped and the frame 4 were to be of bulk type of the same material. The portion 3 of the membrane layer 5 surrounds the aperture 2 and is unsupported between the frame 4 and the opening 2. Referring to FIGS. 4 and 5, which are perspective views from above and below and which show the continuous surface 1 the aperture 2 that is through the unsupported portion 3 of the layer 5 that forms epitaxial contact with and is supported by the surrounding different etch responsive frame 4.

In accordance with the invention, the aperture member, in general, may be fabricated using a crystalline starting structure such as a semiconductor wafer with a heavily doped surface layer, to be the energy entrant continuous surface, labelled element 1.

In view of the fact that the starting material is a wafer, and the opening is to go through the wafer, the processing must take place on both sides of the wafer, so that there will be, standard in the art, alignment for above and below registration employed.

A difference in etch responsiveness capability, of the portion of the wafer that is to become the layer 5, with respect to the bulk portion that is to become the frame 4, is imparted by diffusion or growing through or on the surface 1, so as to produce a crystalline layer about 1–10 micrometers thick of heavily doped semiconductor material. For example, where the semiconductor that is to be the layer 5 would have a doping level of about $7 \times 10^{19}$ atoms/$Cm^3$, then the doping level of the frame 4 would be about $10^{16}$ atoms/$Cm^3$.

The opening 2 is positioned and formed through the membrane 3 by lithographic processes on the energy entrant continuous surface 1 in a location that will be surrounded by the unsupported membrane 3 portion that in turn is to be surrounded by the frame 4.

Diffusion, using the doping level difference in etch responsiveness through both top and lower surfaces of the wafer is used in establishing the thickness of the membrane 3 portion.

Reactive ion etching of the heavily doped regions, followed bt wet etch of the bulk of the wafer from the lower face is used to separate the frame 4.

One of the advantages of the invention is that complete control becomes available of the thickness of the membrane 5 in the unsupported region 3. The thinner that thickness is, the closer to ideal the aperture will be. The control provided by the invention permits thicknesses in the order of 1 micrometer whereas the dimensions currently produced by the techniques in the art involving cutting and punching of foil that is in the range of 10 to 50 micrometers thick. Any shear operation on a sheet material tends to smear the edges. The crystalline structure of the layer 5 of the invention provides a substantial improvement in thickness control.

The desired thickness control is achieved in one way by the diffusing of a dopant through a continuing surface corresponding to element 1 of a starting wafer that has a bulk crystalline material etch responsiveness in a quantity sufficient to provide a thickness of layer 5 with a different etch responsiveness that can serve as an etch stop in fabrication.

The desired thickness control is achieved in another way by the epitaxial growth of a layer of material on the continuous surface that can serve for the etch stop function.

Another of the advantages of the invention is the ability to fabricate the increasing intricate aperture patterns receivng attention in the art. This advantage can be seen in connection with FIGS. 3 and 6 together, in which, in FIG. 3 the unsupported area 3 and the opening 2 are depicted and in FIG. 6 the "double D"; the "dual circle" and the "quad circle" shapes are illustrative of the types of patterns of openings being addressed in the fabrication of devices in the art and which would have to be arranged in a pattern of openings in the unsupported area 3. In the invention, the crystalline makeup of the membrane layer 5 epitaxially attached to the frame 4 provide physical strength not available heretofore in the art and the ability, on the continuous surface 1, to use lithography for position and shape, together with the ability to form the opening 2 in any shape and in any positional relationship, makes possible the use of the relatively gentle in physical stress, fabrication operation of etching.

The invention provides high precision apertures for use including the AIMS tool. In the invention, micrometer scale fabrication techniques are used to achieve dimensional and quality control.

Considering as an example, apertures of silicon made in accordance with the invention, can be fabricated out of a silicon wafer to have a boron doped silicon membrane layer 5 that is 1 to 10 micrometers in thickness that in turn is supported by a 625 micrometer thick frame 4.

Such apertures may be fabricated from standard silicon wafers in accordance with the following process steps assuming above to below individual, and front to back wafer, alignment.

Step 1 Coat the silicon wafers with a silicon etch stop, for example silicon nitride or silicon oxide.

Step 2 Pattern a through hole alignment pattern of the wafers using standard lithographic techniques.

Step 3 Transfer the lithographic pattern through etch stop to silicon using for example hydrofluoric acid or reactive ion etching.

Step 4 Etch silicon to complete open through holes from front to back of wafer in a standard silicon etchant such as potassium hydroxide.

Step 5 Strip the photoresist in a solvent or in a plasma asher.

Step 6 Strip the etch stop using hydrofluoric acid or reactive ion etching.

Note: Steps 1 to 6 are for above (FIG. 1) to below (FIG. 2) alignment.

Step 7 Dope the above (FIG. 1) and the below (FIG. 2) sides of wafers to produce a 5 micrometer layer of silicon doped with boron to about $7 \times 10^{19}$ atoms/$Cm^3$; using implant or diffusion type techniques.

Step 8 Pattern the below (FIG. 2) side of the wafer with a large window pattern for alignment in correlation with the alignment in steps 1 to 6 using standard lithographic techniques.

Step 9 Reactive ion etch the below (FIG. 2) side through the diffused region into the bulk silicon.

Step 10 Strip the photoresist using solvent or a plasma asher.

Step 11 Pattern the above (FIG. 1) side of the wafer with an aperture pattern for alignment in correlation with the alignment in steps 1 to 6 using standard lithographic techniques.

Step 12 Reactive ion etch the above (FIG. 1) side through the diffused region into the bulk silicon.

Step 13 Strip the photoresist using solvent or a plasma asher.

Step 14 Etch in a silicon etchant that is compatible with boron diffused silicon serving as an etch stop using as an example ethylene diamine/pyrocatecol/water until membranes are formed.

What has been described is a technique for providing micrometer range thickness aperture members having a crystalline membrane through which the aperture is placed supported around the periphery by a frame of the crystalline material.

What is claimed is:

1. A process for the fabrication of an energy passing aperture structure comprising:

forming a treated silicon wafer by coating a silicon wafer with a silicon etch stop selected from the group consisting of silicon oxide or silicon nitride;

patterning a through-hole alignment pattern of said wafer using lithographic techniques to form a photoresist;

transferring said photoresist pattern through said etch stop to silicon using an etch method selected from the group consisting of hydrofluoric acid etching or reactive ion etching;

etching said silicon to form open through-holes from front to back of said wafer using potassium hydroxide silicon etchant;

stripping said photoresist using means consisting of a solvent or ion asher;
strip said etch stop using an etch method selected from the group consisting of hydrofluoric acid etching or reactive ion etching;
said treated silicon wafer having an above side and a below side;
doping said above side and said below side of said wafer to produce a 5 micrometer layer of silicon doped with boron to about $7\times10^{19}$ atoms/cm$^3$ using a technique selected from the group consisting of implant or diffusion;
patterning the below side of said wafer with a window pattern using lithographic techniques to form a photoresist;
reactive ion etching said below side through said 5 micrometer layer of silicon doped with boron to about $7\times10^{19}$ atoms/cm$^3$ into said silicon;
stripping said photoresist on said below side using means selected from the group consisting of a solvent or ion asher;
patterning said above side of said wafer with an aperture pattern using lithographic techniques to form a photoresist;
reactive ion etching said above side through said 5 micrometer layer of silicon doped with boron to about $7\times10^{19}$ atoms/cm$^3$ into said silicon;
stripping said photoresist on said above side using means selected from the group consisting of a solvent or ion asher; etching said silicon wafer to form open through-holes from front to back of said wafer using a silicon etchant selected from the group consisting of potassium hyrdoxide and ethylene diamine/pyrocatechol/water blend that is compatible with boron diffused silicon which boron diffused silicon serves as an etch stop, and continuing said etching process until crystalline membranes are formed.

* * * * *